United States Patent
Liu

(10) Patent No.: US 9,423,662 B2
(45) Date of Patent: Aug. 23, 2016

(54) THIN FILM TRANSISTOR, ARRAY SUBSTRATE AND DISPLAY DEVICE

(71) Applicant: BOE TECHNOLOGY GROUP CO., LTD., Beijing (CN)

(72) Inventor: Xiang Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/420,737

(22) PCT Filed: Mar. 24, 2014

(86) PCT No.: PCT/CN2014/073970
§ 371 (c)(1),
(2) Date: Feb. 10, 2015

(87) PCT Pub. No.: WO2015/096287
PCT Pub. Date: Jul. 2, 2015

(65) Prior Publication Data
US 2016/0033800 A1    Feb. 4, 2016

(30) Foreign Application Priority Data
Dec. 23, 2013    (CN) .......................... 2013 1 0718480

(51) Int. Cl.
*H01L 29/06* (2006.01)
*G02F 1/1368* (2006.01)
(Continued)

(52) U.S. Cl.
CPC ....... *G02F 1/1368* (2013.01); *G02F 1/136286* (2013.01); *H01L 27/124* (2013.01);
(Continued)

(58) Field of Classification Search
CPC ............ H01L 27/1222; H01L 27/124; H01L 27/1225; H01L 27/1244; H01L 29/78684; H01L 29/24; H01L 29/42384; H01L 29/78696; H01L 29/7869; H01L 29/1606; G02F 1/1368; G02F 1/136286
See application file for complete search history.

(56) References Cited

U.S. PATENT DOCUMENTS

| 6,476,418 | B1 | 11/2002 | Shiga et al. |
| 2001/0038097 | A1 | 11/2001 | Inoue |

(Continued)

FOREIGN PATENT DOCUMENTS

| CN | 1801492 A | 7/2006 |
| CN | 1825601 A | 8/2006 |

(Continued)

OTHER PUBLICATIONS

English translation of the Written Opinion of the International Searching Authority filed with the Information Disclosure Statement on Feb. 10, 2015.

(Continued)

*Primary Examiner* — Trung Q Dang
*Assistant Examiner* — Wasiul Haider
(74) *Attorney, Agent, or Firm* — Nath, Goldberg & Meyer; Joshua B. Goldberg; Christopher Thomas

(57) ABSTRACT

The present invention provides a thin film transistor, an array substrate and a display device, relating to the field of display technology, for solving the problem that a source/drain electrode metals and a gate metal may be short-circuited in the manufacturing process of an existing bottom-gate thin film transistor. The thin film transistor of the present invention comprises: a gate formed on a substrate, the gate being connected with a gate line; and a semiconductor layer formed on the gate and the gate line, at least a part of the semiconductor layer extends in the direction parallel to the substrate to exceed the edge of the gate. The array substrate of the present invention comprises the thin film transistor, and the display device comprises the array substrate. The present invention may improve the yield of the bottom-gate thin film transistor.

14 Claims, 5 Drawing Sheets

(51) Int. Cl.
*H01L 29/786* (2006.01)
*H01L 27/12* (2006.01)
*G02F 1/1362* (2006.01)
*H01L 29/24* (2006.01)
*H01L 29/423* (2006.01)
*H01L 29/16* (2006.01)

(52) U.S. Cl.
CPC ....... *H01L27/1222* (2013.01); *H01L 27/1225* (2013.01); *H01L 27/1244* (2013.01); *H01L 29/24* (2013.01); *H01L 29/42384* (2013.01); *H01L 29/7869* (2013.01); *H01L 29/78684* (2013.01); *H01L 29/78696* (2013.01); *H01L 29/1606* (2013.01)

(56) References Cited

U.S. PATENT DOCUMENTS

| | | | |
|---|---|---|---|
| 2003/0025166 A1 | 2/2003 | Yamazaki et al. | |
| 2004/0080470 A1* | 4/2004 | Yamazaki | G09G 3/3233 345/76 |
| 2011/0133195 A1 | 6/2011 | Park et al. | |
| 2013/0146882 A1* | 6/2013 | Kimura | H01L 27/1225 257/59 |
| 2013/0337617 A1* | 12/2013 | Kim | G02F 1/136209 438/158 |
| 2015/0357480 A1* | 12/2015 | Yu | H01L 21/02554 257/43 |

FOREIGN PATENT DOCUMENTS

| | | |
|---|---|---|
| CN | 1991553 A | 7/2007 |
| CN | 101527307 A | 9/2009 |
| CN | 103151358 A | 6/2013 |
| CN | 103456795 A | 12/2013 |

OTHER PUBLICATIONS

Office Action dated Nov. 23, 2015 issued in corresponding Chinese Application No. 201310718480.0.

Search Report issued in International Application No. PCT/CN2014/073970, twelve (12) pages.

2nd Office Action issued in Chinese application No. 201310718480.0 dated Feb. 5, 2016.

* cited by examiner

US 9,423,662 B2

THIN FILM TRANSISTOR, ARRAY SUBSTRATE AND DISPLAY DEVICE

This is a National Phase Application filed under 35 U.S.C. 371 as a national stage of PCT/CN2014/073970, filed Mar. 24, 2014, and claims priority benefit from Chinese Application No. 201310718480.0, filed Dec. 23, 2013, the content of each of which is hereby incorporated by reference in its entirety.

FIELD OF THE INVENTION

The present invention relates to the field of display technology, and in particular relates to a thin film transistor, an array substrate and a display device.

BACKGROUND OF THE INVENTION

Thin film transistor liquid crystal display (referred to as TFT-LCD) is popular in the market due to its characteristics of small size, low power consumption, no radiation and the like. A metal oxide TFT with the advantages of high mobility, good uniformity, transparency and simple manufacturing process may better meet the development requirement of the TFT-LCD with large size and high refresh rate.

As shown in FIGS. 1 through 3, in the process of manufacturing the metal oxide TFT in the prior art, an etch stop layer is generally added on a metal oxide semiconductor layer to prevent the metal oxide semiconductor layer from being etched when source and drain metal electrodes are etched, so that the metal oxide semiconductor layer is protected from being etched by an etchant for source and drain metals. A design of contact via hole is generally adopted for the etch stop layer. FIG. 1 shows the relationships of position and size between a gate 11 and a semiconductor layer 20 in the prior art, the gate 11 is disposed below the semiconductor layer 20 (a gate insulating layer is disposed between the semiconductor layer 20 and the gate 11 and is not shown in FIG. 1). In a direction (e.g. BB direction in FIG. 1) perpendicular to a gate line 12, the area of the semiconductor layer 20 is smaller than that of the gate 11, and in a direction (e.g. AA direction in FIG. 1) parallel to the gate line 12, the semiconductor layer 20 is flush with the gate 11. FIG. 2 shows the relationships of position and size between a source electrode contact via hole 3 and a drain electrode contact via hole 4 on the semiconductor layer 20 in the prior art, and FIG. 3 is a cross sectional view taken along C-C direction in FIG. 2. As shown in FIG. 2 and FIG. 3, a gate insulating layer 6 (not shown in FIG. 2) is disposed on the gate 11, a semiconductor layer (active layer) 20 is formed on the gate insulating layer 6, and an etch stop layer 5 (not shown in FIG. 2) is deposited on the semiconductor layer 20. The etch stop layer 5 comprises the source electrode contact via hole 3 and the drain electrode contact via hole 4, through which a source electrode and a drain electrode are electrically connected with the active layer 20 respectively.

In the process of implementing the present invention, the inventor discovers that the prior art at least has the following problem: the required precision for alignment is strict, but the precision achieved by the existing process is limited, and in addition, the area of semiconductor layer is smaller than that of the gate. Therefore, when the etch stop layer is etched to form the source electrode contact via hole and the drain electrode contact via hole, the contact via holes may be deviated from positions above the semiconductor layer and positioned above the gate insulating layer where no semiconductor layer exists, and thus the gate insulating layer may be continuously etched during etching, which will lead to a short circuit between the source or drain electrode metal and the gate metal, thereby reducing the product yield.

SUMMARY OF THE INVENTION

For solving the technical problem that a source or drain electrode metal and a gate metal may be short-circuited when a source electrode contact via hole and a drain electrode contact via hole are formed by etching in an existing array substrate adopting a bottom-gate thin film transistor, the present invention provides a thin film transistor, an array substrate and a display device for effectively solving the problem of short circuit between the source or drain electrode metal and the gate metal, so as to improve the product yield.

The technical solutions adopted for solving the technical problem of the present invention involve a thin film transistor, comprising: a gate formed on a substrate, the gate being connected with a gate line; and a semiconductor layer formed on the gate and the gate line. At least a part of the semiconductor layer extends in a direction parallel to the substrate to exceed an edge of the gate.

Preferably, the semiconductor layer may exceed the gate in the direction which is parallel to the substrate and perpendicular to the gate line.

Further preferably, one side of the semiconductor layer away from the gate line may exceed the gate, and the middle part of one side of the semiconductor layer away from the gate line is recessed towards a direction close to the gate line and is flush with the edge of one side of the gate away from the gate line, wherein the middle part is defined on the basis of two ends of the semiconductor layer in the direction parallel to the gate line.

Further preferably, one side of the semiconductor layer close to the gate line may also exceed the gate, and the middle part of one side of the semiconductor layer close to the gate line is recessed towards a direction away from the gate line to expose a part of the gate.

Further preferably, one side of the semiconductor layer away from the gate line may exceed the gate, and the middle part of one side of the semiconductor layer away from the gate line is recessed towards the direction close to the gate line to expose a part of the gate, wherein the middle part is defined on the basis of two ends of the semiconductor layer in the direction parallel to the gate line.

Further preferably, one side of the semiconductor layer close to the gate line may also exceed the gate, and the middle part of one side of the semiconductor layer close to the gate line is recessed towards the direction away from the gate line to expose a part of the gate.

Further preferably, one side of the semiconductor layer close to the gate line may exceed the gate, and the middle part of one side of the semiconductor layer close to the gate line is recessed towards the direction away from the gate line to expose a part of the gate, wherein the middle part is defined on the basis of two ends of the semiconductor layer in the direction parallel to the gate line.

Preferably, the semiconductor layer exceeds the gate in the direction parallel to the gate line.

Preferably, the thin film transistor may further include an etch stop layer covering the semiconductor layer, the etch stop layer comprises a drain electrode contact via hole and a source electrode contact via hole above the semiconductor layer, the source electrode contact via hole and the drain electrode contact via hole are respectively in contact with the semiconductor layer to form contact parts, and the minimum distance between the edge of each contact part and the edge of the semiconductor layer in the direction parallel to the substrate may be at least 4 microns.

Preferably, the semiconductor layer is made of a metal oxide semiconductor or a graphene semiconductor.

Preferably, the thickness of the semiconductor layer is ranged from 10 Å to 1500 Å.

At least a part of the semiconductor layer of the thin film transistor of the present invention exceeds the gate, thus, when the etch stop layer is etched to form the source electrode contact via hole and the drain electrode contact via hole, even if the positions of the contact via holes are deviated from the positions required by design, since at least a part of the semiconductor layer exceeds the gate and the semiconductor layer still exists between the deviated contact via holes and the gate, the semiconductor layer acts as an etch stop layer, and the gate insulating layer will not be etched to have reduced thickness and even etched off, so that the gate insulating layer may be prevented from being broken down by static electricity, the problem of short circuit between the source or drain electrode metal and the gate electrode metal may be effectively solved, and then the yield of the thin film transistor may be greatly improved.

The technical solutions adopted for solving the technical problem of the present invention involve an array substrate, comprising the above thin film transistor.

The array substrate of the present invention comprises the above thin film transistor, so that the yield of the array substrate is further improved.

The technical solutions adopted for solving the technical problem of the present invention involve a display device, comprising the above array substrate.

The display device of the present invention comprises the above array substrate, the yield of the array substrate is improved, so that the production cost of the display device is reduced.

DESCRIPTION OF THE PREFERRED EMBODIMENT

Figure 1:
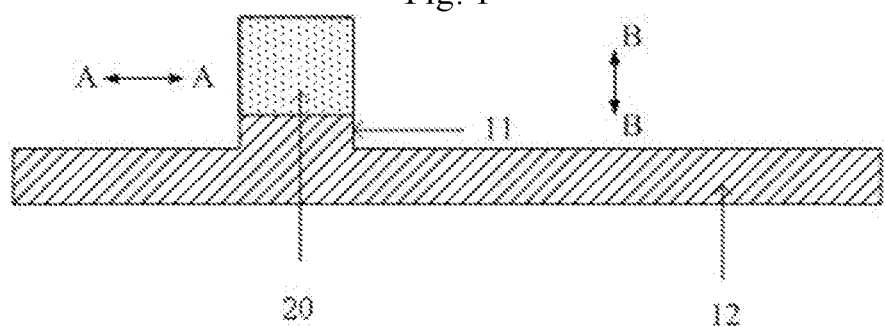
FIG. 1 is a schematic plan view of a gate and a semiconductor layer of an array substrate in the prior art.
Figure 2:
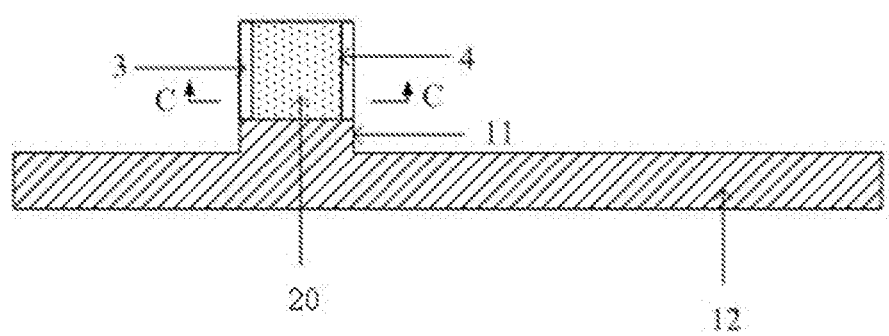
FIG. 2 is a schematic plan view illustrating positions and sizes of a source electrode contact via hole and a drain electrode contact via hole of an array substrate on a semiconductor layer in the prior art.
Figure 3:
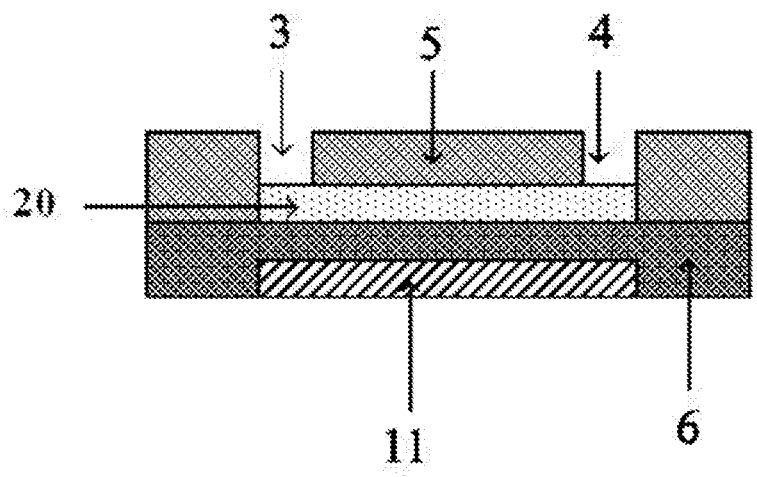
FIG. 3 is a cross sectional view taken along C-C direction in FIG. 2.

To make those skilled in the art better understand the technical solutions of the present invention, the present invention will be further described below in detail in conjunction with the accompanying drawings and specific embodiments.

First Embodiment

As shown in FIGS. 4 through 9, this embodiment provides a thin film transistor, comprising: a gate 11 and a gate line 12 which are formed on a substrate, wherein the gate 11 is connected with the gate line 12; a gate insulating layer 6 which covers the gate 11 and the gate line 12; a semiconductor layer 2 which is formed on the gate insulating layer 6; and an etch stop layer 5, which covers the semiconductor layer 2 and comprises a drain electrode contact via hole 4 and a source electrode contact via hole 3 which are located on the semiconductor layer 2, wherein at least a part of the semiconductor layer 2 exceeds an edge of the gate 11. More specifically, when being observed from the top of the thin film transistor, at least a part of the semiconductor layer 2 extends in a direction parallel to the substrate to exceed the edge of the gate 11. Of course, the thin film transistor further comprises other known structures such as a passivation layer, and will not be described in detail herein.

In this case, the gate 11 and the gate line 12 may be made of one of metals of Cr, W, Ti, Ta, Mo, Al, Cu and the like or an alloy of combination thereof, or a gate metal layer consisting of multiple layers of the above metals may be utilized as the material of the gate and the gate line.

Preferably, the thickness of the gate insulating layer is ranged from 500 Å to 5000 Å. The gate insulating layer may also have a double-layered structure. The gate insulating layer may be made of an oxide, a nitride or an oxygen-nitrogen compound. Of course, the gate insulating layer is not limited to the above-mentioned thickness and materials, and may also be specifically set according to actual needs.

Preferably, the semiconductor layer 2 is made of a metal oxide semiconductor or a graphene semiconductor.

It should be noted that, when the semiconductor layer 2 is made of a metal oxide, the metal oxide may be material comprising oxygen (O) and one or more elements of indium (In), gallium (Ga), zinc (Zn) and tin (Sn). Further preferably, the metal oxide may be one of IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb and Cd—Sn—O.

When the source electrode contact via hole 3 and the drain electrode contact via hole 4 are formed by etching, since the semiconductor layer 2 made of the metal oxide semiconductor or the graphene semiconductor is unlikely to be etched by an etchant for the etch stop layer 5, the semiconductor layer 2 plays a role of an etch stop layer to protect the gate insulating layer 6 below from being etched.

Preferably, the thickness of the semiconductor layer 2 made of the graphene semiconductor or one of the above-described metal oxides is ranged from 10 Å to 1500 Å, and the semiconductor layer 2 with such thickness is sufficient to play a role of an etch stop layer, so that the gate insulating layer 6 below the semiconductor layer 2 can be prevented from being etched.

In the thin film transistor of this embodiment, there are following several situations in which at least a part of the semiconductor layer 2 exceeds the gate 11.

Figure 4:
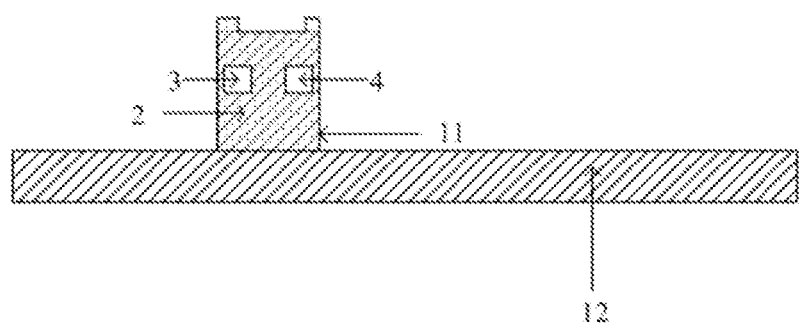
FIG. 4 is a schematic plan view of an array substrate in which a semiconductor layer exceeds a gate in a direction perpendicular to a gate line, according to a first embodiment of the present invention.
Figure 5:
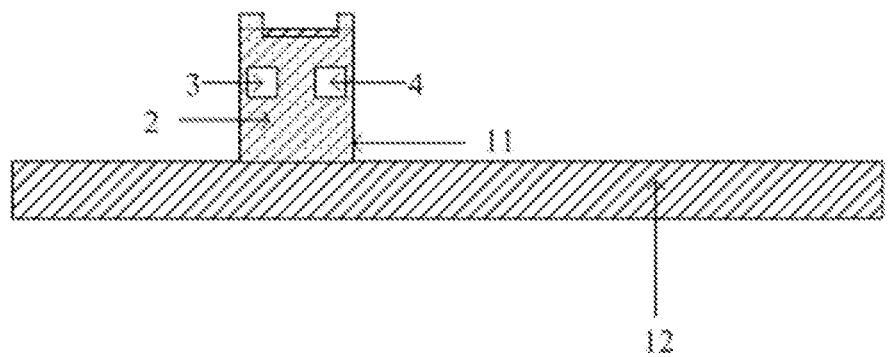
FIG. 5 is a schematic plan view of another array substrate in which the semiconductor layer exceeds the gate in the direction perpendicular to the gate line, according to the first embodiment of the present invention.
Figure 6:
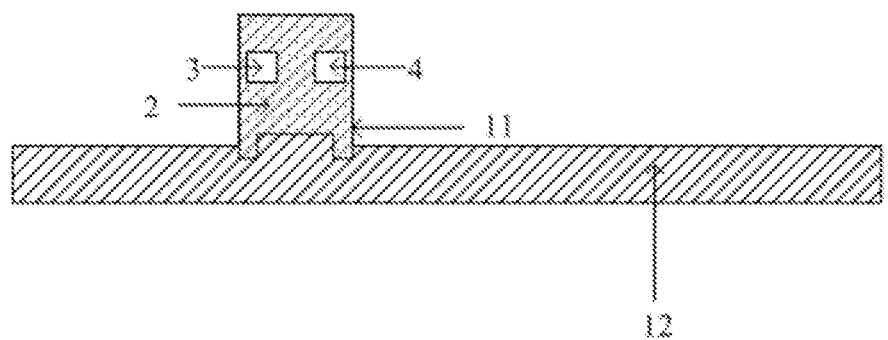
FIG. 6 is a schematic plan view of yet another array substrate in which the semiconductor layer exceeds the gate in the direction perpendicular to the gate line, according to the first embodiment of the present invention.

Preferably, as shown in FIGS. 4 through 6, the semiconductor layer 2 exceeds the gate 11 in the direction which is parallel to the substrate and perpendicular to the gate line 12. Under such a situation, since the semiconductor layer 2 exceeds the gate 11, the source electrode contact via hole 3 and the drain electrode contact via hole 4 may be prevented from deviating from the semiconductor layer 2 in the direction which is parallel to the substrate and perpendicular to the gate line 12 in the process of forming the source electrode contact via hole 3 and the drain electrode contact via hole 4 by etching, so that the gate insulating layer 6 may not be etched off, and then the problem of short circuit between a source or drain electrode metal and a gate metal is effectively solved.

Further preferably, as shown in FIG. 4, one side of the semiconductor layer 2 away from the gate line 12 exceeds the gate 11 in the direction which is parallel to the substrate and perpendicular to the gate line 12, and the middle part of one side of the semiconductor layer 2 away from the gate line 12 is recessed towards a direction close to the gate line 12 to be flush with the edge of one side of the gate 11 away from the gate line 12. Here, the middle part is defined based on two ends of the semiconductor layer in the direction parallel to the gate line 12. In this way, with the design of recess, the part of one side of the semiconductor layer 2 away from the gate line 12, which exceeds the gate 11, will not cause a source and a drain to be electrically connected with each other under the irradiation of a back light, so as to prevent the thin film transistor from failure.

It could be understood that, as long as the middle part of one side of the semiconductor layer 2 exceeding the gate 11 is recessed in the direction which is parallel to the substrate and perpendicular to the gate line 12, the middle part may be prevented from being conductive, in a case of non-recessed, under the irradiation of the back light, so that the thin film transistor is prevented from failure due to the electrical connection between the source and the drain. Two sides of the semiconductor layer 2 in the direction parallel to the gate line 12 are respectively connected with the source and the drain, and it is insignificant that parts of the two sides of the semiconductor layer 2, which exceed the gate 11, are conducted under irradiation, so that the failure may be avoided as long as the middle part of one side of the semiconductor layer 2 exceeding the gate 11 is recessed towards a direction close to the gate line 12 in the direction which is parallel to the substrate and perpendicular to the gate line 12.

More preferably, as shown in FIG. 5, one side of the semiconductor layer 2 away from the gate line 12 exceeds the gate 11 in the direction which is parallel to the substrate and perpendicular to the gate line 12, and the middle part of one side of the semiconductor layer 2 away from the gate line 12 is recessed towards a direction close to the gate line 12 to expose a part of the gate 11. Under such a situation, the overlapping area between the semiconductor layer 2 and the gate 11 is reduced, so that the parasitic capacitance between the semiconductor layer 2 and the gate 11 is reduced, and adverse effects on the performance of the thin film transistor are reduced.

Further preferably, as shown in FIG. 6, one side of the semiconductor layer 2 close to the gate line 12 exceeds the gate 11 in the direction which is parallel to the substrate and perpendicular to the gate line 12, and the middle part of one side of the semiconductor layer 2 close to the gate line 12 is recessed towards a direction away from the gate line 12 to expose a part of the gate 11. Under such a situation, the overlapping area between the semiconductor layer 2 and the gate 11 becomes smaller, so that the parasitic capacitance between the semiconductor layer 2 and the gate 11 is further reduced, and adverse effects on the performance of the thin film transistor are further reduced. It should be noted that, in the direction which is parallel to the substrate and perpendicular to the gate line 12, FIG. 6 only shows one structure for one side of the semiconductor layer 2 away from the gate line 12, namely one side of the semiconductor layer 2 away from the gate line 12 is flush with the edge of one side of the gate 11 away from the gate line 12. However, referring to FIGS. 4 and 5, the structure of one side of the semiconductor layer 2 away from the gate line 12 in FIG. 6 may also be one of the followings: one side of the semiconductor layer 2 away from the gate line 12 exceeds the gate 11, and the middle part of one side of the semiconductor layer 2 away from the gate line 12 is recessed towards a direction close to the gate line 12 to be flush with the edge of one side of the gate 11 away from the gate line 12; and alternatively, one side of the semiconductor layer 2 away from the gate line 12 exceeds the gate 11, and the middle part of one side of the semiconductor layer 2 away from the gate line 12 is recessed towards a direction close to the gate line 12 to expose a part of the gate 11.

It should be noted that, in the direction perpendicular to the gate line 12, one side of the semiconductor layer 2 away from the gate line 12 and/or one side of the semiconductor layer 2 close to the gate line 12 are recessed, and in the direction parallel to the gate line 12, the positions where the drain electrode contact via hole 4 and the source electrode contact via hole 3 are in contact with the semiconductor layer 2 are respectively located on two sides of the above-mentioned recess. Accordingly, the two sides of the semiconductor layer 2 in the direction parallel to the gate line 12 may not be recessed, otherwise, the semiconductor layer 2 may not act as an etch stop layer.

Figure 7:
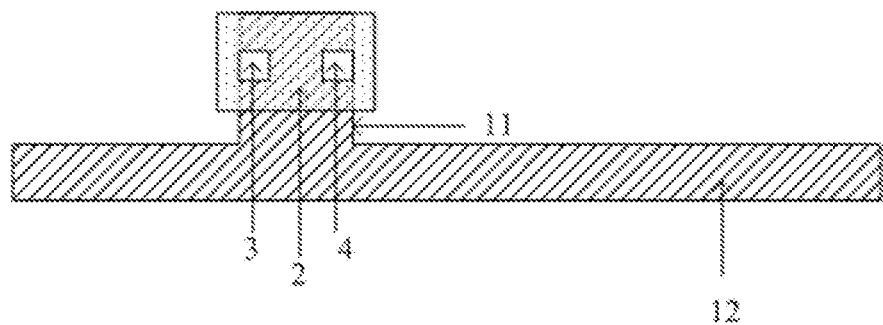
FIG. 7 is a schematic plan view of an array substrate in which the semiconductor layer exceeds the gate in the direction parallel to the gate line, according to the first embodiment of the present invention.

Preferably, as shown in FIG. 7, the semiconductor layer 2 exceeds the gate 11 in the direction parallel to the gate line 12. In the prior art, two ends of the semiconductor layer 20 in the direction parallel to the gate line 12 are respectively flush with two ends of the gate line 11, so that in the process of forming the source electrode contact via hole 3 and the drain electrode contact via hole 4 by etching, if the positions of the contact via holes are deviated from the semiconductor layer 2 in the direction parallel to the gate line 12, the gate insulating layer 6 below the contact via holes 3 and 4, which are deviated from the semiconductor layer 2, is etched. In such a case, the gate insulating layer 6 is thinned and even completely etched off, so that the gate insulating layer 6 is broken down by static electricity during power-on, and even the situation of short circuit between the source or drain electrode metal and the gate metal occurs. However, this situation may be effectively avoided when the semiconductor layer 2 exceeds the gate 11 in the direction parallel to the gate line 12.

Figure 8:
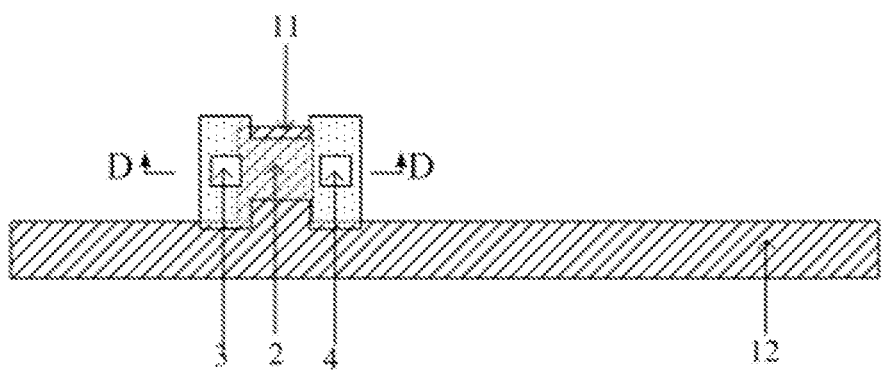
FIG. 8 is a schematic plan view of an array substrate in which the semiconductor layer exceeds the gate both in the direction perpendicular to the gate line and in the direction parallel to the gate line, according to the first embodiment of the present invention.
Figure 9:
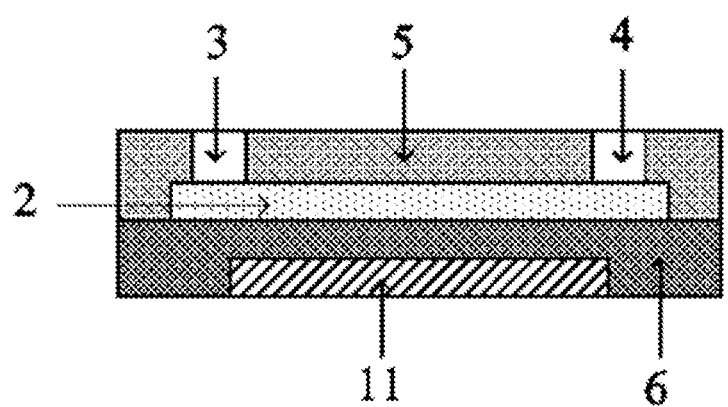
FIG. 9 is a cross sectional view taken along D-D direction in FIG. 8.

It should be noted that, the semiconductor layer 2 may be in different shapes by combining the above-mentioned several situations of the semiconductor layer 2, and apparently, thin film transistors comprising the semiconductor layers 2 in the above-mentioned different shapes fall within the protection scope of the present invention. For example, through combination, the semiconductor layer 2 may exceed the gate 11 in the direction perpendicular to the gate line 12 and the direction parallel to the gate line 12, the middle part of one side of the semiconductor layer 2 away from the gate line 12 is recessed towards a direction close to the gate line 12, and the middle part of one side of the semiconductor layer 2 close to the gate line 12 is recessed towards a direction away from the gate line 12, the schematic plan view of the semiconductor layer 2 is shown in FIG. 8, and the cross sectional view thereof is shown in FIG. 9.

In this embodiment, preferably, the source electrode contact via hole 3 and the drain electrode contact via hole 4 are respectively in contact with the semiconductor layer 2 to form contact parts, and the minimum distance between the edge of each contact part and the edge of the semiconductor layer 2 in the direction parallel to the substrate is at least 4 microns. That is to say, the contact via hole 3 or 4 is in contact with the semiconductor layer 2 to form a contact part, the contact part is in the shape of the contact via hole 3 or 4, and the minimum distance between the edge of the contact part and the edge of the semiconductor layer 2 in the direction parallel to the substrate is at least 4 microns, so as to meet the requirement of existing process precision.

At least a part of the semiconductor layer 2 of the thin film transistor in this embodiment exceeds the gate 11. When the etch stop layer 5 is etched to form the source electrode contact via hole 3 and the drain electrode contact via hole 4, even if the positions of the via holes are deviated from the positions required by design, since at least a part of the semiconductor layer 2 exceeds the gate 11 and the semiconductor layer 2 act as an etch stop layer to protect the gate insulating layer 6 below the semiconductor layer 2, the gate insulating layer 6 is not etched, so that the problem of short circuit between the source or drain electrode metal and the gate metal may be effectively solved, and the yield of the thin film transistor may be greatly improved.

This embodiment further provides a manufacturing method of the above-mentioned thin film transistor, referring to FIGS. 4 through 9, comprising the following steps.

A gate metal film is formed on a substrate, and a pattern comprising a gate 11 and a gate line 12 is formed by a patterning process, the gate 11 is connected with the gate line 12.

In this step, the method of forming the gate metal film generally involves multiple manners such as deposition, coating and sputtering, and the patterning process generally comprises photoresist coating, exposure, development, etching, photoresist stripping and the like.

In this step, the substrate may be an inorganic material based substrate such as a glass substrate or a quartz substrate, and may also be made of an organic material.

Subsequently, a gate insulating layer 6 is deposited on the substrate on which the gate 11 and the gate line 12 are formed, then an active layer is deposited, and a pattern of a semiconductor layer 2 is formed by a patterning process. At least a part of the semiconductor layer 2 exceeds the gate 11, and more specifically, at least a part of the semiconductor layer 2 extends in the direction parallel to the substrate to exceed the edge of the gate 11.

Next, an etch stop layer 5 is deposited on the semiconductor layer 2, and at least a drain electrode contact via hole 4 and a source electrode contact via hole 3 are formed by a patterning process.

Obviously, the manufacturing method of the thin film transistor in this embodiment should further comprise the manufacturing steps of known structures such as source and drain electrodes and a passivation layer, which will not be redundantly described herein in detail.

With the manufacturing method of the thin film transistor provided by this embodiment, the thin film transistor manufactured by the method can effectively avoid the short circuit between a source or drain electrode metal and a gate metal, so that the yield of the thin film transistor is improved.

Second Embodiment

This embodiment provides an array substrate comprising the thin film transistor in the first embodiment and known structures such as pixel electrodes, which will not be redundantly described herein in detail.

The array substrate of this embodiment comprises the thin film transistor in the first embodiment, the problem of short circuit between a source or drain electrode metal and a gate metal may be effectively solved. Therefore, the yield of the array substrate is further improved.

Third Embodiment

This embodiment provides a display device comprising the array substrate in the second embodiment in addition to known structures such as a color filter substrate. The display device may be any product or component with a display function, such as a liquid crystal display panel, an electronic paper, a mobile phone, a tablet computer, a television, a display, a notebook computer, a digital photo frame or a navigator.

The display device of this embodiment comprises the above-mentioned array substrate, and the yield of the array substrate is improved, so that the production cost of the display device is reduced.

It could be understood that, the above implementations are merely exemplary embodiments adopted for illustrating the principle of the present invention, however, the present invention is not limited thereto. Various variations and improvements may be made for those of ordinary skill in the art without departing from the spirit and essence of the present invention, and these variations and improvements are deemed to fall within the protection scope of the present invention.

The invention claimed is:

1. A thin film transistor, comprising:
   a gate formed on a substrate, the gate being connected with a gate line; and
   a semiconductor layer formed on the gate and the gate line,
   wherein at least a part of the semiconductor layer extends in a direction parallel to the substrate to exceed an end edge of the gate,
   one side of the semiconductor layer away from the gate line exceeds the end edge of the gate in a direction perpendicular to the gate line,
   a middle part of one side of the semiconductor layer away from the gate line is recessed towards a direction close to the gate line, the middle part is defined on the basis of two ends of the semiconductor layer in the direction parallel to the gate line, and
   two side edges of the recessed part of the semiconductor layer are overlapping with the gate edges vertical to the gate line.

2. The thin film transistor of claim 1, wherein the middle part of one side of the semiconductor layer away from the gate line is recessed towards the direction close to the gate line and is flush with the end edge of one side of the gate away from the gate line.

3. The thin film transistor of claim 2, wherein one side of the semiconductor layer close to the gate line also exceeds the gate, and the middle part of one side of the semiconductor layer close to the gate line is recessed towards a direction away from the gate line to expose a part of the gate.

4. The thin film transistor of claim 1, wherein the middle part of one side of the semiconductor layer away from the gate line is recessed towards the direction close to the gate line to expose a part of the gate.

5. The thin film transistor of claim 4, wherein one side of the semiconductor layer close to the gate line also exceeds the gate, and the middle part of one side of the semiconductor layer close to the gate line is recessed towards a direction away from the gate line to expose a part of the gate.

6. The thin film transistor of claim 1, wherein one side of the semiconductor layer close to the gate line exceeds the gate, and the middle part of one side of the semiconductor layer close to the gate line is recessed towards a direction away from the gate line to expose a part of the gate.

7. The thin film transistor of claim 1, wherein two end edges of the semiconductor layer exceeds the gate in the direction parallel to the gate line.

8. The thin film transistor of claim 1, wherein the thin film transistor further comprises an etch stop layer covering the semiconductor layer, the etch stop layer comprises a drain electrode contact via hole and a source electrode contact via hole which are located above the semiconductor layer, the source electrode contact via hole and the drain electrode contact via hole are respectively in contact with the semiconductor layer to form contact parts, and the minimum distance between the edge of each contact part and the edge of the semiconductor layer in the direction parallel to the substrate is at least 4 microns.

9. The thin film transistor of claim 1, wherein the semiconductor layer is made of a metal oxide semiconductor or a graphene semiconductor.

10. The thin film transistor of claim 1, wherein the thickness of the semiconductor layer is ranged from 10 Å to 1500 Å.

11. An array substrate, comprising thin film transistors, the thin film transistor comprising:
   a gate formed on a substrate, the gate being connected with a gate line; and
   a semiconductor layer formed on the gate and the gate line,
   wherein at least a part of the semiconductor layer extends in a direction parallel to the substrate to exceed an end edge of the gate,
   one side of the semiconductor layer away from the gate line exceeds the end edge of the gate in a direction perpendicular to the gate line,
   a middle part of one side of the semiconductor layer away from the gate line is recessed towards a direction close to the gate line, the middle part is defined on the basis of two ends of the semiconductor layer in the direction parallel to the gate line, and
   two side edges of the recessed part of the semiconductor layer are overlapping with the gate edges vertical to the gate line.

12. The array substrate of claim 11, wherein two end edges of the semiconductor layer further exceeds the gate in the direction parallel to the gate line.

13. A display device, comprising an array substrate, the array substrate comprising thin film transistors, the thin film transistor comprising:
   a gate formed on a substrate, the gate being connected with a gate line; and
   a semiconductor layer formed on the gate and the gate line,
   wherein at least a part of the semiconductor layer extends in a direction parallel to the substrate to exceed an end edge of the gate,
   one side of the semiconductor layer away from the gate line exceeds the end edge of the gate in a direction perpendicular to the gate line,
   a middle part of one side of the semiconductor layer away from the gate line is recessed towards a direction close to the gate line, the middle part is defined on the basis of two ends of the semiconductor layer in the direction parallel to the gate line, and
   two side edges of the recessed part of the semiconductor layer are overlapping with the gate edges vertical to the gate line.

14. The display device of claim 13, wherein two end edges of the semiconductor layer further exceeds the gate in the direction parallel to the gate line.

* * * * *